United States Patent
Tekletsadik

(10) Patent No.: US 7,655,928 B2
(45) Date of Patent: Feb. 2, 2010

(54) ION ACCELERATION COLUMN CONNECTION MECHANISM WITH INTEGRATED SHIELDING ELECTRODE AND RELATED METHODS

(75) Inventor: Kasegn D. Tekletsadik, Rexford, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 232 days.

(21) Appl. No.: 11/693,237

(22) Filed: Mar. 29, 2007

(65) Prior Publication Data

US 2008/0238326 A1    Oct. 2, 2008

(51) Int. Cl.
 H01J 27/00 (2006.01)
 H01J 37/317 (2006.01)
 H01J 27/06 (2006.01)
 H01J 27/10 (2006.01)
 G21F 3/00 (2006.01)
 A61N 5/00 (2006.01)

(52) U.S. Cl. .............. 250/492.1; 250/492.3; 250/515.1; 315/111.16; 315/111.81; 315/111.91

(58) Field of Classification Search ............. 250/491.1, 250/492.1, 492.2, 492.21, 492.3; 315/111.01–111.91; 439/44–50
 See application file for complete search history.

(56) References Cited

U.S. PATENT DOCUMENTS

| | | | |
|---|---|---|---|
| 1,610,903 A | | 12/1926 | Trencham |
| 3,277,423 A | | 10/1966 | Rose |
| 4,231,766 A | * | 11/1980 | Spurgin .................. 96/79 |
| 4,330,182 A | * | 5/1982 | Coleman .................. 257/56 |
| 4,643,745 A | * | 2/1987 | Sakakibara et al. ............ 96/76 |
| 4,789,801 A | * | 12/1988 | Lee ..................... 310/308 |
| 4,812,711 A | * | 3/1989 | Torok et al. ............ 315/111.91 |
| 5,077,500 A | * | 12/1991 | Torok et al. ............ 315/111.91 |
| 5,134,299 A | * | 7/1992 | Denholm ................. 250/492.2 |
| 5,378,899 A | * | 1/1995 | Kimber ................ 250/492.21 |
| 5,504,341 A | * | 4/1996 | Glavish ................ 250/492.21 |
| 5,597,322 A | | 1/1997 | Inaba et al. |
| 5,667,564 A | * | 9/1997 | Weinberg ................. 96/58 |
| 5,729,028 A | * | 3/1998 | Rose ..................... 250/492.21 |
| 6,176,977 B1 | * | 1/2001 | Taylor et al. .............. 204/176 |
| 6,639,227 B1 | * | 10/2003 | Glavish et al. ........... 250/492.2 |
| 6,664,547 B2 | * | 12/2003 | Benveniste ............. 250/423 R |
| 6,664,548 B2 | * | 12/2003 | Benveniste et al. ....... 250/423 P |
| 7,453,069 B2 | * | 11/2008 | Buonodono et al. ..... 250/396 R |
| 2003/0029563 A1 | * | 2/2003 | Kaushal et al. .......... 156/345.1 |

(Continued)

FOREIGN PATENT DOCUMENTS

DE    8502491 U1    7/1986

(Continued)

*Primary Examiner*—Bernard E Souw

(57) ABSTRACT

Ion accelerating devices including connection mechanisms with integrated shielding electrode and related methods are disclosed. According to an embodiment, an ion accelerating device of an ion implantation system comprises: a first element; a first connection system within the first element, the first connection system including a first connector and a first encapsulated shielding electrode around the first connector; and a second connection system within a second element other than the first element, the second connection system being coupled to the first connector; wherein the first encapsulated shielding electrode includes a first shielding portion adjacent to a first interface surface of the first element where the second connection system interfaces with the first element, in a cross-sectional view, the first shielding portion being substantially U-shaped.

18 Claims, 6 Drawing Sheets

U.S. PATENT DOCUMENTS

| | | | |
|---|---|---|---|
| 2003/0127606 A1 | 7/2003 | Matsumoto et al. | |
| 2003/0205679 A1* | 11/2003 | Benveniste | 250/423 R |
| 2003/0205680 A1* | 11/2003 | Benveniste et al. | 250/423 R |
| 2004/0155612 A1* | 8/2004 | Krichtafovitch | 315/500 |
| 2008/0135783 A1* | 6/2008 | Buonodono et al. | 250/492.3 |
| 2008/0238326 A1* | 10/2008 | Tekletsadik | 315/111.91 |
| 2008/0315127 A1* | 12/2008 | Torregrosa et al. | 250/492.3 |
| 2009/0039295 A1* | 2/2009 | Yu et al. | 250/515.1 |
| 2009/0047801 A1* | 2/2009 | Low et al. | 439/50 |
| 2009/0236547 A1* | 9/2009 | Huang et al. | 250/492.21 |

FOREIGN PATENT DOCUMENTS

| | | |
|---|---|---|
| DE | 3611462 A1 | 10/1987 |
| WO | 20060076359 A1 | 7/2006 |

* cited by examiner

ION ACCELERATION COLUMN CONNECTION MECHANISM WITH INTEGRATED SHIELDING ELECTRODE AND RELATED METHODS

BACKGROUND

1. Technical Field

The present disclosure relates generally to ion implantation, and more particularly, to an ion accelerating device including connection mechanisms with an integrated shielding electrode and related methods.

2. Related Art

Ion implantation is a standard technique for introducing conductivity altering impurities into, or doping, semiconductor wafers. A typical ion implantation process uses an energetic ion beam to introduce impurities (ions) into semiconductor wafers. During ion implantation, a source feed material is energized to generate an ion beam, and the generated ion beam needs to be accelerated by an acceleration column. An acceleration column may be required to accelerate an ion beam at, for example, 670 kV. Preferably, the acceleration is accomplished by the ion beam passing through seven lenses internal to the acceleration column with voltages graded across the lenses due to ion optics requirements.

Active or passive grading schemes are used to control/produce the graded voltages, which require electrical and mechanical connections to the lenses through, e.g., a respective bushing unit. The connection point or termination point, if not protected, is usually a high electrical stress region and can be a weakest point of the accelerating column, which may lead to high voltage failures. As shown in FIG. 6, when a grading circuit board 312 is connected to a bushing unit 314 through a connector 316, at connection point 318, an interface is formed between solid insulation material of bushing unit 314 and/or grading circuit board 312, gas environment 322 that includes air, SF6, or/and other gases, and metal material of connectors 316 (referred to as triple junction). The equal potential line (iso-potential line) 320 is also adjacent to connection point 318 due to the metal material of connector 316. The high electrical stress on connection point 318, defined as $(\Delta V)/d$ where $\Delta V$ indicates the difference in electrical potentials and d indicates a distance, may cause an electrical discharge. For example, air beaks down at the electrical stress of 75 kV per inch. This electrical stress may exist between the two connectors 316, between connection point 318 and a ground (not shown) and/or between connection points 318 of two adjacent bushing units 314. The electrical discharge may cause electrical failures at connection point 318.

SUMMARY

A first aspect of the disclosure is directed to an ion accelerating device of an ion implantation system, the ion accelerating device comprising: a first element; a first connection system within the first element, the first connection system including a first connector and a first encapsulated shielding electrode around the first connector; and a second connection system within a second element other than the first element, the second connection system being coupled to the first connector; wherein the first encapsulated shielding electrode includes a first shielding portion adjacent to a first interface surface of the first element where the second connection system interfaces with the first element, in a cross-sectional view, the first shielding portion being substantially U-shaped.

A second aspect of the disclosure is directed to an ion accelerating device, comprising: a first element including a first connection system, the first connection system including an encapsulated shielding electrode; and a second element including a second connection system; wherein in the case the first connection system and the second connection system interface, the encapsulated shielding electrode draws an electrical stress away from an interface between the first connection system and the second connection system where a solid insulation material, a surrounding environment, and a metal material interface, the surrounding environment being one of a gas environment or a vacuum environment.

A third aspect of the disclosure is directed to a method of protecting an ion accelerating device from a high voltage failure due to a connection to an element in a high voltage environment, the method comprising: embedding a connection point within an insulation material of the element; and providing an encapsulated shielding electrode connected to the connection point and extending around the connection point such that in the case that a connection occurs at the connection point, an equal potential line is drawn away from the connection point by the encapsulated shielding electrode.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

1. Ion Implantation System Overview

Figure 1:
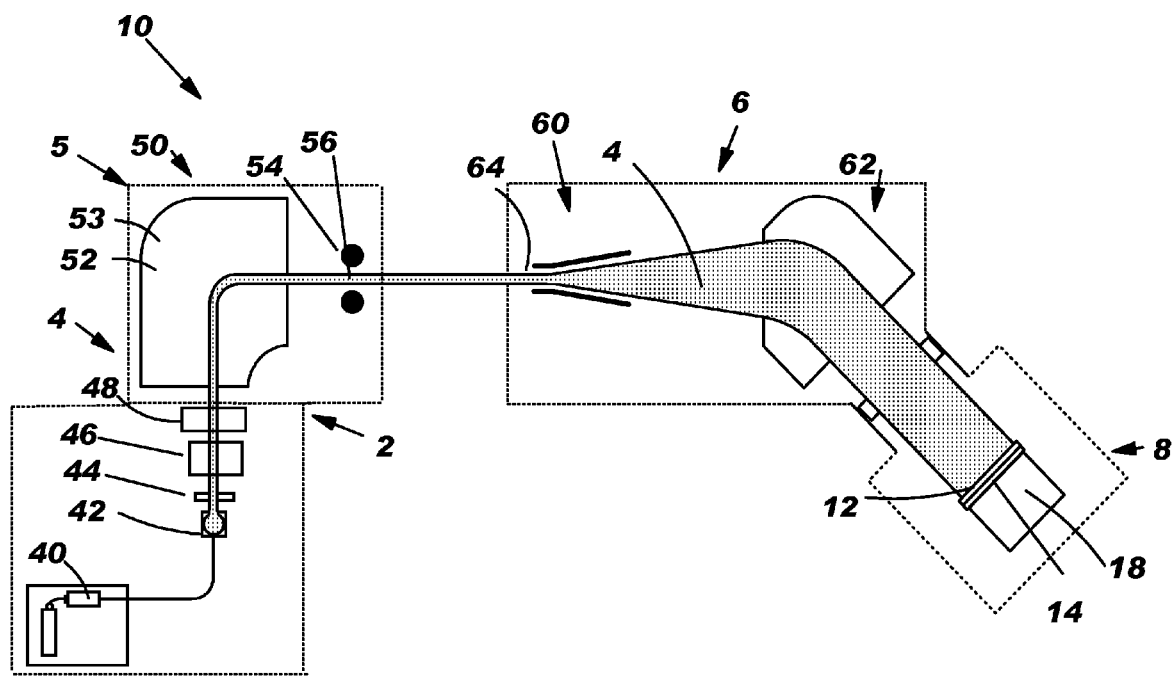
FIG. 1 shows a schematic view of an ion beam implantation system according to one embodiment of the disclosure.

With reference to the accompanying drawings, FIG. 1 shows an illustrative ion implantation system 10. Ion implantation system 10 includes an ion beam generating system 2 for generating and transmitting an ion beam 4, through ion beam filtering system 5 and ion beam scanning system 6, to a target system 8. Ion beam generating system 2 may include any now known or later developed ion beam generator such as those available from Varian Semiconductor Equipment Associates. Typically, target system 8 includes one or more semiconductor targets 12 (e.g., a wafer) mounted to a platen 14. Ion implantation system 10 may include additional components known to those skilled in the art. It will be understood that the entire path traversed by ion beam 4 is evacuated during an ion implantation.

Besides the above-described components, ion beam generating system 2 may include a gas flow 40, an ion beam source 42, an extraction manipulator 44, a source filter magnet 46, and an accelerating/decelerating column 48. Source filter magnet 46 is preferably positioned in close proximity to ion beam source 42. Extraction manipulator 44 is positioned between source filter magnet 46 and ion beam source 42. Acceleration/deceleration column 48 is positioned between source filter magnet 46 and mass analyzer 50.

Ion beam filtering system 5 may include a mass analyzer 50 including, for example, a dipole analyzing magnet 52 with a semicircular radius 53, and a mass resolving slit 54 having a resolving aperture 56. As is known in the art, ion beam 4 may include different combinations of ions in different stages of the path it traverses.

Scanning system 6 may include, for example, a scanner 60 and an angle corrector 62. Scanner 60, which may be an electrostatic scanner, deflects filtered ion beam 4.

Although an illustrative ion implantation system 10 has been described above, it should be understood by those skilled in the art that the current disclosure can be used with any now known or later developed system to generate and scan ion beam 4. It should be understood that the current disclosure can be used with any now known or later developed process and methods of ion implantation.

2. Ion Accelerating Device

Figure 2:
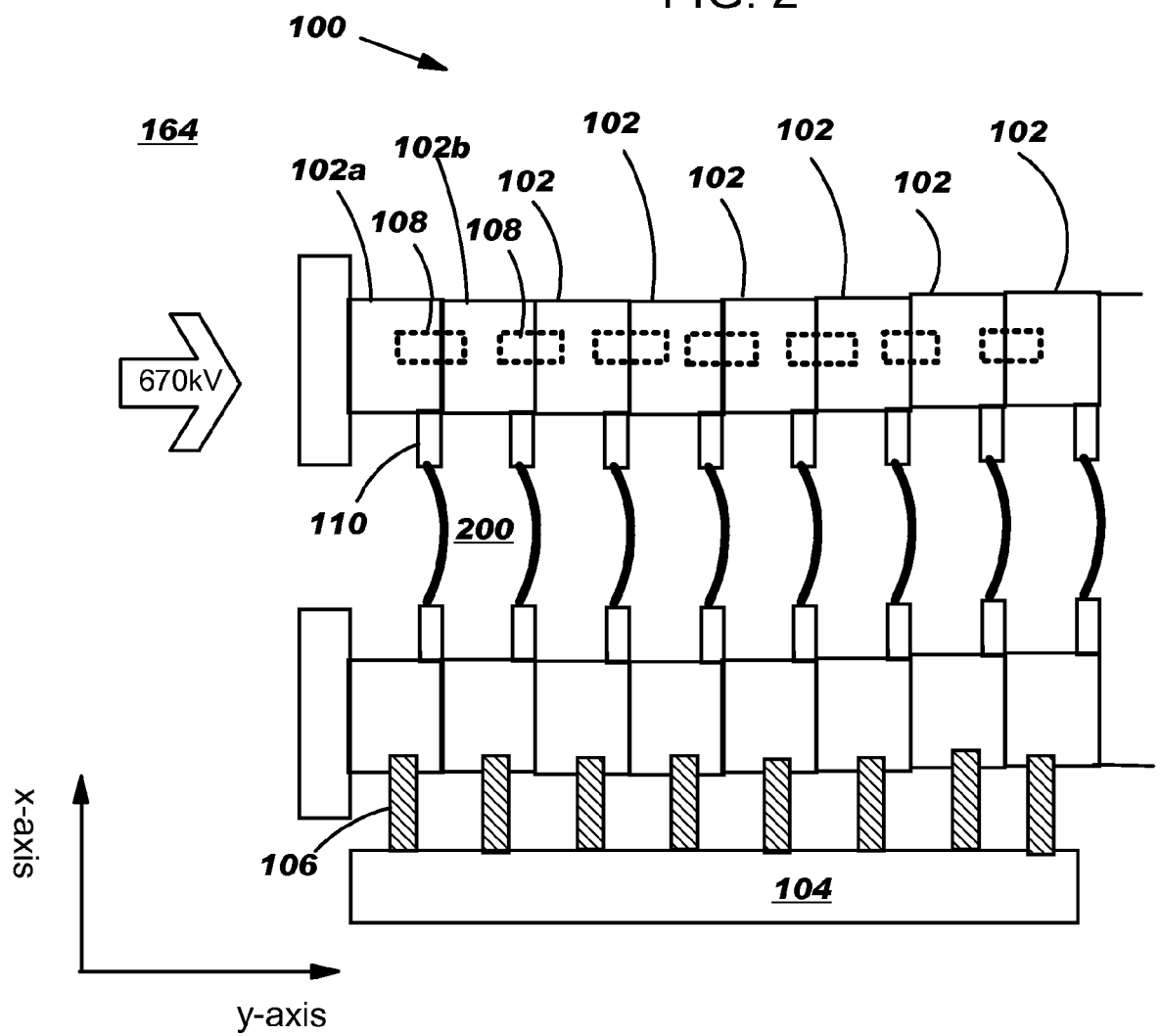
FIG. 2 shows a schematic cross-sectional view of an ion accelerating device according to one embodiment of the disclosure.

Referring to FIG. 2, a cross-sectional view of an ion accelerating device 100 is shown. Ion accelerating device 100 may implement accelerating/decelerating column 48, or may be located elsewhere within ion implantation system 10 (FIG. 1). According to one embodiment, ion accelerating device 100 includes multiple (or a series of) accelerating column bushing units (bushing unit) 102 (8 are shown) and a (or a series of) grading circuit board 104. Grading circuit board 104 may be attached/coupled to bushing units 102 to provide a graded voltage to each of bushing units 102. According to an embodiment, grading circuit board 104 provides voltages that are graded by approximately 95 kV between two immediately adjacent bushing units 102, e.g., 102a and 102b.

Bushing units 102 and/or grading circuit board 104 are connected through electrical connection mechanisms 106 and/or mechanical connection mechanisms 108. Electrical connection mechanisms 106 may be positioned, e.g., between: (a) two bushing units 102, (b) within a bushing unit 102 and between a lens plate 110 and an internal conductor (not shown), and/or (c) between a circuit outside a bushing unit 102, e.g., grading circuit board 104, and a bushing unit 102, etc. In the description herein, an electrical connection mechanism 106 between grading circuit board 104 and a bushing unit 102 is used as an illustrative example, but this example does not limit the scope of the disclosure. A mechanical connection mechanism 108 may be positioned between: (a) two bushing units 102, (b) within a bushing unit 102 and between an internal component, e.g., a lens plate 110, and the bushing unit insulation material, and/or (c) between a bushing unit 102 and a device outside the bushing unit 102, etc. In the description herein, a mechanical connection mechanism 108 between two bushing units 102 is used as an illustrative example, but this example does not limit the scope of the disclosure. As is appreciated, for either an electrical connection mechanism 106 or a mechanical connection mechanism 108, an interface is generated at a connection point between solid materials of, inter alia, bushing unit 102, a gas environment 164, e.g., air, outside bushing unit 102, or a vacuum environment 200, e.g., inside bushing unit 102, and a metal, e.g., of a bolt or a connection pin. Gas environment 164 includes, but is not limited to, air, sulfur hexafluoride (SF6), or/and other gases. A mechanical connection mechanism 108 may also involve electrical potentials at the connection point because of, e.g., floating electrons. As such, the disclosures regarding electrical connection mechanism 106 may apply to mechanical connection mechanism 108, and vice versa.

Figure 3:
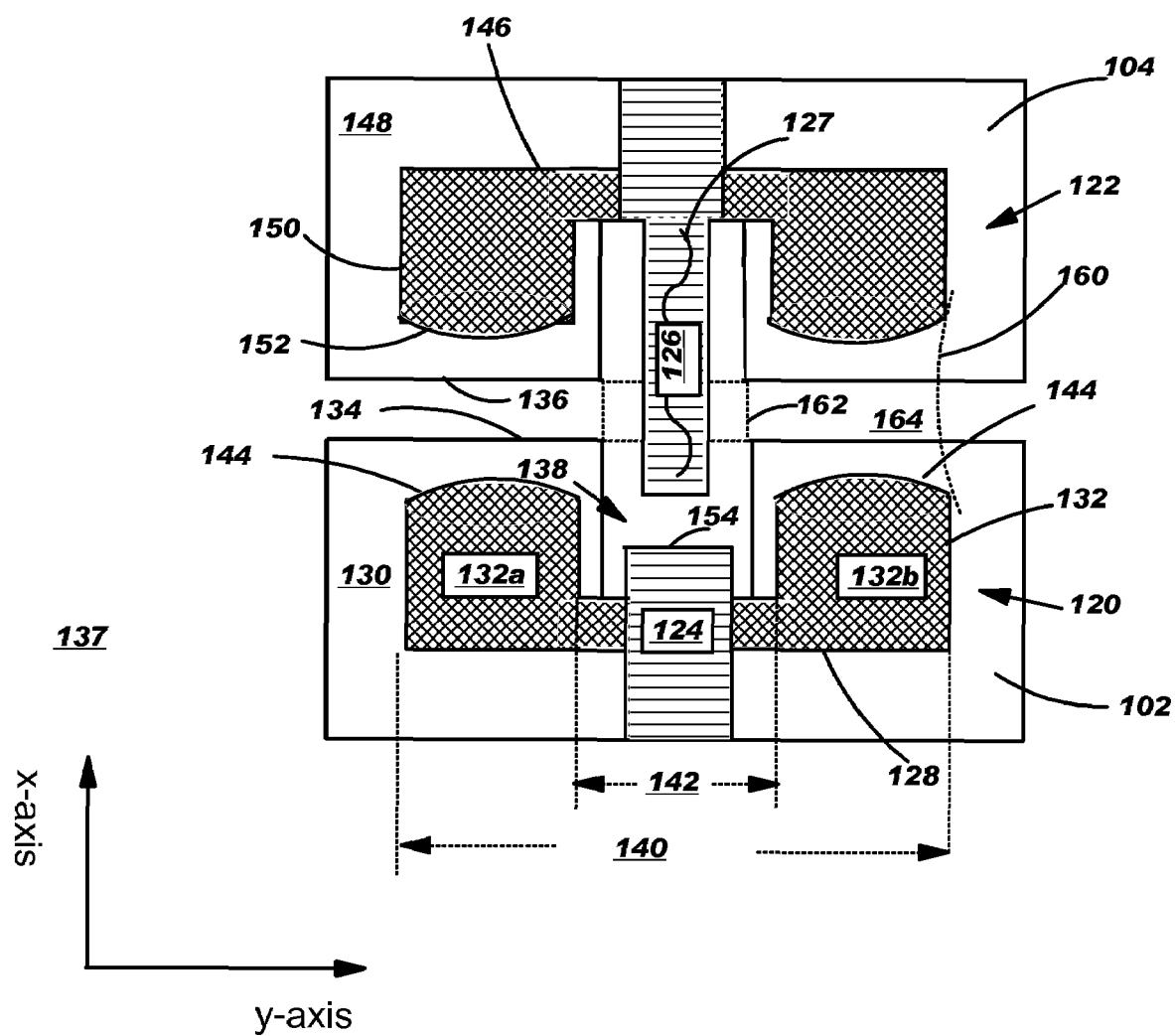
FIG. 3 shows a schematic cross-sectional view of a connection mechanism according to one embodiment of the disclosure.

FIG. 3 shows an embodiment of an electrical connection mechanism 106 between a grading circuit board 104 and a bushing unit 102 in a cross-sectional view. Electrical connection mechanism 106 includes a connection system 120 within bushing unit 102 and a connection system 122 within grading circuit board 104. Connection system 120 includes a connector 124, e.g., a recess portion, that can be coupled to a connector 126, e.g., a projection portion, of connection system 122. Connection system 120 further includes an encapsulated shielding electrode 128 connected to connector 124 and extending around connector 124. Encapsulated shielding electrode 128 is encapsulated by an electrical insulation material 130 of bushing unit 102.

According to an embodiment, encapsulated shielding electrode 128 includes a shielding portion 132 extending toward an interface surface 134 of bushing unit 102 and/or interface surface 136 of grading circuit board 104. In plane 137 of the x-axis, along which connection system 120 couples to connection system 122, shielding portion 132 is substantially U-shaped facing interface surfaces 134, 136. That is, opening 138 of the U-shape faces interfaces 134, 136. According to an embodiment, shielding portion 132 is substantially symmetric relative to connector 124. That is, portion 132a of shielding portion 132 on one side of connector 124 is substantially the mirror image of portion 132b on the other side of connector 124 in plane 137. However, the current disclosure is not limited to this specific embodiment.

According to an embodiment, an outer dimension 140 of shielding portion 132 in the y-axis perpendicular to the x-axis is smaller than approximately 2.1 inches. An inner dimension 142 of shielding portion 132 in the y-axis of plane 137 is smaller than outer dimension 140 by at least approximately 0.25 inches. However, other dimensions are also possible and included in the disclosure.

Figure 4:
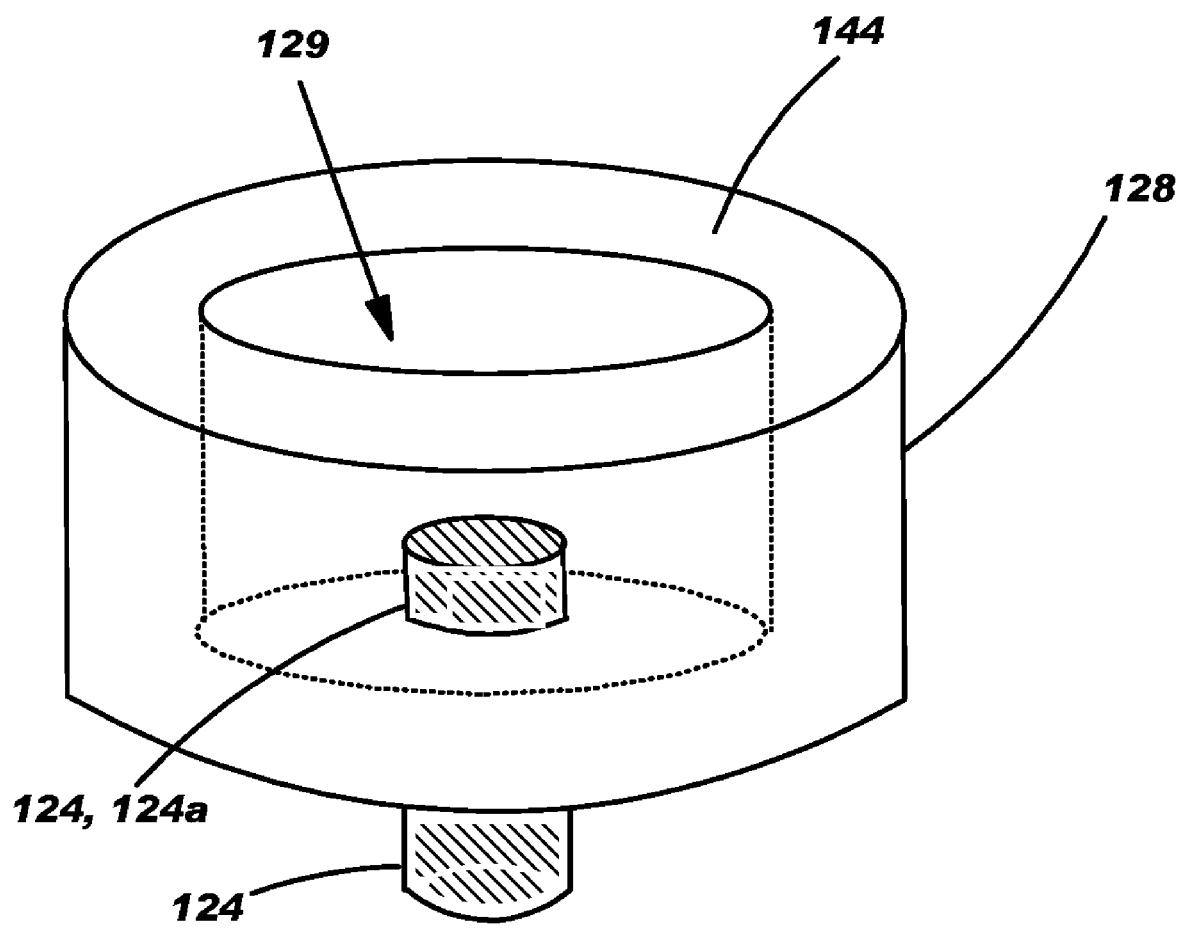
FIG. 4 shows an encapsulated shielding electrode in a three-dimensional view according to one embodiment of the disclosure.

According to an embodiment, encapsulated shielding electrode 128 is substantially cup-shaped in a three-dimensional view, as shown in FIG. 4. In FIG. 4, dotted lines are used to indicate an inner portion 129 of substantially cup-shaped encapsulated shielding electrode 128. Portion 124a of connector 124 is within inner portion 129, although portion 124a is shown with solid lines and a pattern for sake of illustration.

Referring back to FIG. 3, edge 144 of the cup-shaped encapsulated shielding electrode 128 is substantially rounded (shown in dotted line) in plane 137 of the x-axis and the y-axis adjacent to interface surfaces 134, 136. Other configurations are also possible and included in the disclosure.

Connection system 122 includes an encapsulated shielding electrode 146 connected to connector 126 and extending around connector 126. Encapsulated shielding electrode 146 is encapsulated by electrical insulation material 148. Encapsulated shielding electrode 146 includes a shielding portion 150 adjacent to interface surfaces 134, 136. In a cross-sectional view in plane 137 of the x-axis, shielding portion 150 is substantially U-shaped facing interface surfaces 134, 136.

According to an embodiment, shielding portion 150 is substantially similar to shielding portion 132 in size and shape. As shown in FIG. 3, shielding portions 150 and 132 are positioned opposite to one another. That is, edges 144 and 152 face one another.

According to an embodiment, connector 126 may be a spring 127 loaded pin, or a pogo pin, or a combination of the two. Connector 126 is capable of being received by connector 124.

In operation, connector 124 and connector 126 couple to one another at connection point 154. Consequently, the potential of grading circuit board 104, i.e., the graded voltage, is transmitted from connection system 122 to connection system 120. An equal potential line 160 will be established between edges 144 and 152 of encapsulated shielding electrodes 146 and 128, respectively. As a consequence, the electrical stress is drawn away from interface 162 (shown in dotted line) around connection point 154 where solid insulation materials 130, 148, gas environment 164 (or a vacuum environment) and metals 124 and 126 interface. As such, electrical stress around connection point 154 is substantially reduced or eliminated to protect ion accelerating device 100 (FIG. 2) from high voltage failures due to the connection.

As described above, the description regarding electrical connection mechanism 106 of FIG. 3 may similarly apply to a mechanical connection. Grading circuit board 104 is only used as an illustrative example of a device electrically connected to bushing unit 102. Other devices are also included. For example, two bushing units 102 may be electrically connected through connection mechanism 106.

Figure 5:
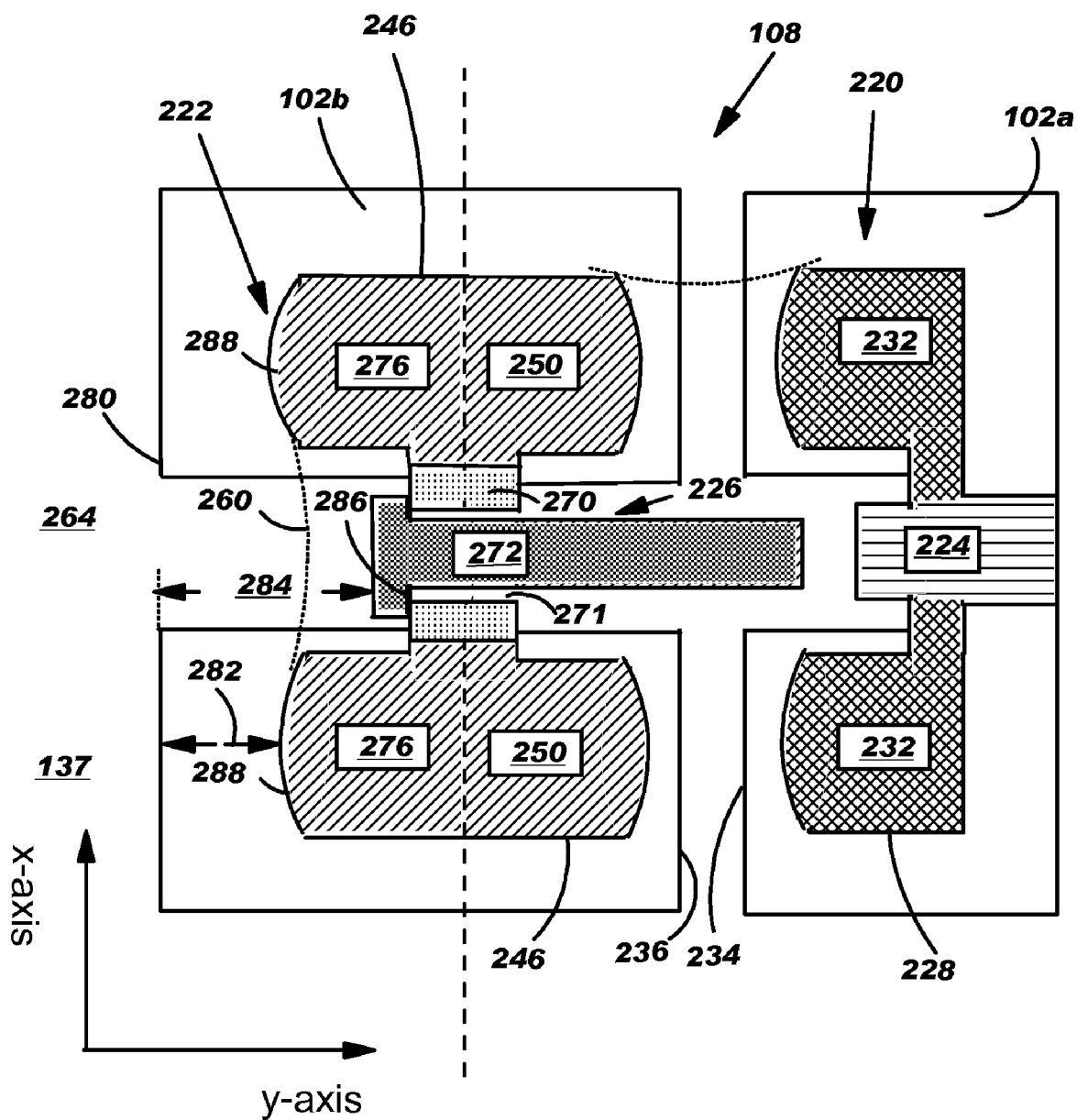
FIG. 5 shows a schematic cross-sectional view of a connection mechanism according to an alternative embodiment of the disclosure.
Figure 6:
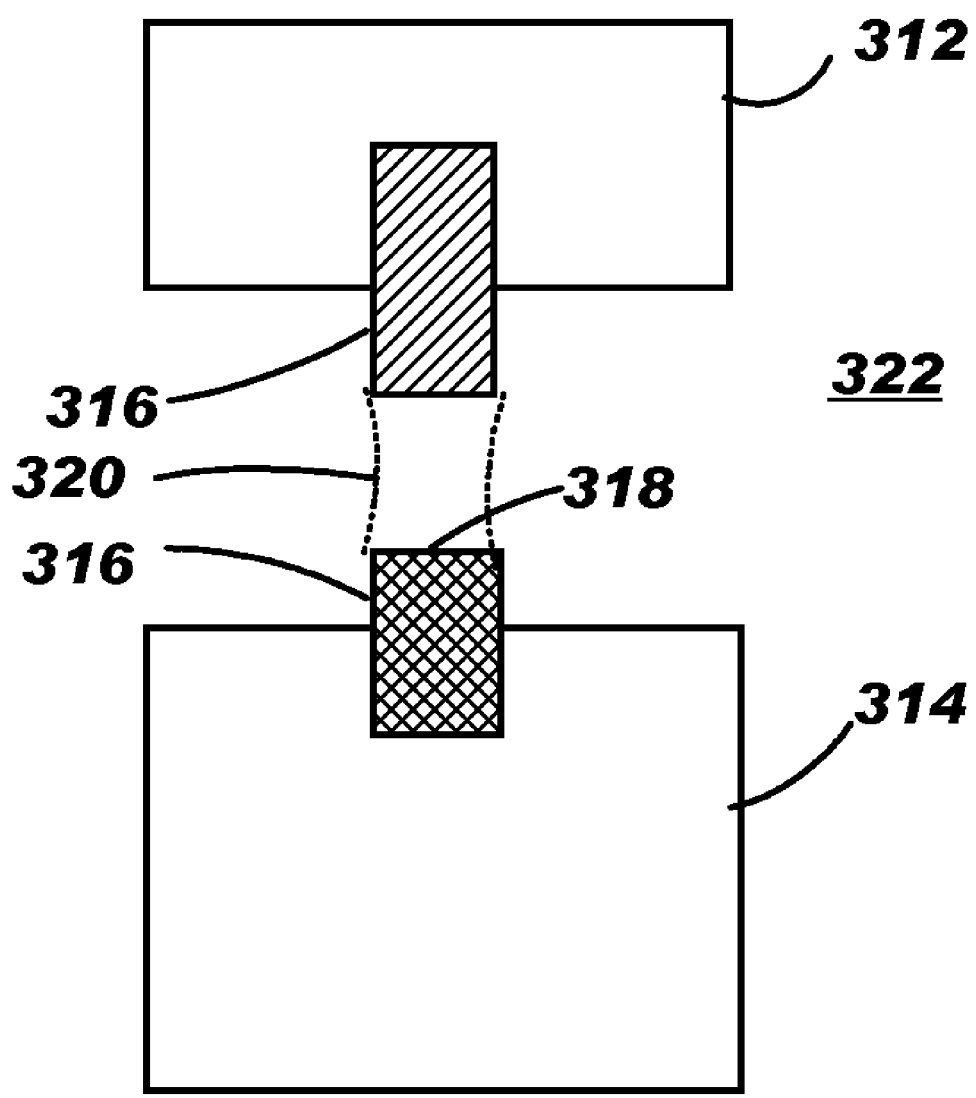
FIG. 6 shows an example of a conventional electrical connection to a bushing unit.

Turning to FIG. 5, an embodiment of a mechanical connection mechanism 108 between two bushing units 102 (102a, 102b) are shown in a cross-sectional view in plane 137. According to an embodiment, bushing units 102a and 102b are mechanically connected through connection mechanism 108. However, connection mechanism 108 may also be used for an electrical connection between bushing units 102. Mechanical connection mechanism 108 includes connection system 220 in bushing unit 102a and connection system 222 in bushing unit 102b. Connection system 220 includes connector 224 and encapsulated shielding electrode 228. Descriptions of encapsulated shielding electrodes 128 (FIG. 3) also apply to encapsulated shielding electrode 228. For example, encapsulated shielding electrode 228 includes a shielding portion 232 extending toward interfaces 234, 236. Shielding portion 232 is substantially U-shaped facing interface surfaces 234, 236, in a cross-sectional view in plane 137 of the y-axis along which connection system 220 couples to connection system 222.

Connection system 222 includes a connector 226 and an encapsulated shielding electrode 246. Encapsulated shielding electrode 246 includes a shielding portion 250 extending toward interface surfaces 234, 236. Descriptions of shielding portion 150 of FIG. 3 apply to shielding portion 250. For example, shielding portion 250 is substantially U-shaped facing interface surfaces 234, 236 in a cross-sectional view in plane 137.

Connector 226 may include a tubular portion 270 and a bolt portion 272 coupled to tubular portion 270 from gas environment 264 (or a vacuum environment in an alternative embodiment). It should be appreciated that tubular portion 270 may have any external and/or internal shape, and all are included in the invention, provided that a tunnel 271 passes through tubular portion 270 from one end to the other.

Encapsulated shielding electrode 246 includes another shielding portion 276 extending toward an interface surface 280 on bushing unit 102b where connection system 222 interfaces with gas environment 264. Shielding portion 276 is substantially similar to shielding portion 132 of FIG. 3, unless clearly described otherwise. For example, shielding portion 276 is substantially U-shaped facing interface surface 280 in a cross-sectional view in plane 137. According to an embodiment, in a cross-sectional view in plane 137, encapsulated shielding electrode 246 (i.e., shielding portion 276 plus shielding portion 250) is substantially H-shaped.

According to an embodiment, shielding portion 276 extends toward interface surface 280 to a position at least approximately ⅜ inches closer to interface surface 280 than bolt portion 272 in the case that bolt portion 272 is coupled to tubular portion 270 in a working condition. A working condition refers to the situation in which connector 226, including bolt portion 272 and tubular portion 270, are coupled to connector 224 to make bushing units 102a and 102b mechanically connected. That is, distance 282 is at least ⅜ inches shorter than distance 284.

In operation, as a connection occurs at connection point 286, i.e., bolt potion 272 and tubular portion 270 couple to one another, a floating voltage may be transmitted between and/or among bolt portion 272, tubular portion 270, and connector 224. An equal potential line 260 will be established adjacent to edge 288 of shielding portion 276. That is, the electrical stress is drawn away from connection point/interface 286 where solid insulation material 248, gas environment 264 (or a vacuum environment), and metal, e.g., of bolt portion 272, interface.

It should be appreciated that mechanical connection mechanism 108 of FIG. 5 may also be used for an electrical connection, which is also included in the disclosure. The connection between bushing units 102a and 102b is used for illustrative purposes, and other connections are also possible. For example, mechanical connection mechanism 108 may be used for a connection inside bushing unit 102, i.e., in a vacuum environment 200 (FIG. 2), which is included in the disclosure.

Although the invention is shown regarding connections to a bushing unit, it should be appreciated that the similar design can also be used in other areas where two dielectric/insulation sections join with an interface with weaker dielectric strength.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An ion accelerating device of an ion implantation system, the ion accelerating device comprising:
   a first element comprising a first bushing unit;
   a first connection system within the first element, the first connection system including a first connector and a first encapsulated shielding electrode around the first connector; and
   a second connection system within a second element, the second element comprising one of a grading circuit board or a second different bushing unit, the second connection system being coupled to the first connector;
   wherein the first encapsulated shielding electrode includes a first shielding portion adjacent to a first interface surface of the first element where the second connection system interfaces with the first element, in a cross-sectional view, the first shielding portion being substantially U-shaped.

2. The ion accelerating device of claim 1, wherein the first shielding portion is substantially symmetric relative to the first connector.

3. The ion accelerating device of claim 1, wherein the first encapsulated shielding electrode is electrically connected to the first connector.

4. The ion accelerating device of claim 1, wherein an inner dimension of the first shielding portion in a first axis perpendicular to a second axis along which the second connection system couples the first connector is smaller than an outer dimension of the first shielding portion in the first axis by at least approximately 0.25 inches.

5. The ion accelerating device of claim 1, wherein the first encapsulated shielding electrode is substantially cup-shaped.

6. The ion accelerating device of claim 5, wherein an edge of the first encapsulated shielding electrode is substantially rounded adjacent to the first interface surface.

7. The ion accelerating device of claim 1, wherein the second connection system includes a second connector and a second encapsulated shielding electrode extending around the second connector, the second encapsulated shielding electrode including a second shielding portion adjacent to the first interface surface, and, in a cross-sectional view, the second shielding portion being substantially U-shaped.

8. The ion accelerating device of claim 7, wherein the second shielding portion is substantially similar to the first shielding portion in size and shape.

9. The ion accelerating device of claim 7, wherein the second connector is at least one of a spring loaded pin or a pogo pin to be received by the first connector.

10. The ion accelerating device of claim 7, wherein the second element is electrically connected to the first element though the first and second connection systems.

11. The ion accelerating device of claim 7, wherein the second encapsulated shielding electrode includes a third shielding portion adjacent to a second interface surface between the second element and a surrounding environment, the surrounding environment being one of a gas environment or a vacuum environment, the third shielding portion being substantially U-shaped in a cross-sectional view.

12. The ion accelerating device of claim 11, wherein, in the cross-sectional view, the second encapsulated shielding electrode is substantially H-shaped.

13. The ion accelerating device of claim 12, wherein the second element is mechanically coupled to the first element though the first and the second connection systems.

14. The ion accelerating device of claim 13, wherein the second element includes the second different bushing taut.

15. The ion accelerating device of claim 1, wherein the first encapsulated shielding electrode is encapsulated by an electrical insulation material.

16. The ion accelerating device of claim 1, wherein the first connector includes a tubular portion and a bolt portion coupled into the tubular portion from one of a gas environment or a vacuum environment.

17. The ion accelerating device of claim 16, wherein the first shielding portion extends toward the first interface surface to a position at least approximately 3/8 inches closer to the first interface surface than the bolt portion in the case that the bolt portion is coupled to the tubular portion in a working condition.

18. An ion accelerating device, comprising:
a first element comprising a first bushing unit, the first element including a first connection system, the first connection system including an encapsulated shielding electrode; and
a second element comprising one of a grading circuit board or a second different bushing unit, the second element including a second connection system;
wherein in the case the first connection system and the second connection system interface, the encapsulated shielding electrode draws an electrical stress away from an interface between the first connection system and the second connection system where a solid insulation material, a surrounding environment, and a metal material interface, the surrounding environment being one of a gas environment or a vacuum environment.

* * * * *